United States Patent
McNally et al.

(10) Patent No.: US 11,476,098 B2
(45) Date of Patent: Oct. 18, 2022

(54) SYSTEM AND METHOD FOR REMOTE SENSING A PLASMA

(71) Applicant: DUBLIN CITY UNIVERSITY, Dublin (IE)

(72) Inventors: Patrick J. McNally, Dublin (IE); Sean Kelly, Dublin (IE)

(73) Assignee: DUBLIN CITY UNIVERSITY, Dublin (IE)

(*) Notice: Subject to any disclaimer, the term of this patent is extended or adjusted under 35 U.S.C. 154(b) by 20 days.

(21) Appl. No.: 16/498,049

(22) PCT Filed: Mar. 23, 2018

(86) PCT No.: PCT/EP2018/057556
§ 371 (c)(1),
(2) Date: Sep. 26, 2019

(87) PCT Pub. No.: WO2018/177965
PCT Pub. Date: Oct. 4, 2018

(65) Prior Publication Data
US 2021/0104387 A1    Apr. 8, 2021

(30) Foreign Application Priority Data

Mar. 31, 2017  (GB) ..................... 1705202

(51) Int. Cl.
*H01J 37/32* (2006.01)
(52) U.S. Cl.
CPC .. *H01J 37/32963* (2013.01); *H01J 37/32972* (2013.01); *H01J 37/3299* (2013.01)

(58) Field of Classification Search
CPC .......... H01J 37/32963; H01J 37/32972; H01J 37/3299
See application file for complete search history.

(56) References Cited

U.S. PATENT DOCUMENTS

| 4,588,993 | A | 5/1986 | Babij et al. |
| 2005/0183821 | A1 | 8/2005 | Parsons |

(Continued)

FOREIGN PATENT DOCUMENTS

| WO | 2004006298 A2 | 1/2004 |
| WO | 2007041280 | 4/2007 |

OTHER PUBLICATIONS

Hartfuss, H.J.; "RF techniques in plasma diagnostics"; Plasma Phys. Control. Fusion vol. 40; (1998); pp. A231-A250.

(Continued)

*Primary Examiner* — Yuechuan Yu
(74) *Attorney, Agent, or Firm* — K&L Gates LLP (57) ABSTRACT

The invention provides a method and system to remotely monitor a plasma (3) comprising a magnetic field antenna (2) positioned in the near electromagnetic field of a coupled plasma source wherein the magnetic field antenna is a magnetic loop antenna placed in the near electromagnetic field and measure near field signals emitted from the plasma source. A radio system (1) is utilised to analyse the low power signal levels across a wide frequency band. Plasma paramaters such as series, or geometric, resonance plasma and electron-neutral collision frequencies are evaluated via a fitting of resonant features present on higher harmonics of the driving frequency to identify arcing, pump or matching failure events, common in fabrication plasma systems.

13 Claims, 4 Drawing Sheets

(56) References Cited

U.S. PATENT DOCUMENTS

| | | | |
|---|---|---|---|
| 2006/0169410 A1 | 8/2006 | Maeda et al. | |
| 2007/0227657 A1* | 10/2007 | Yamazawa | H01J 37/32082 |
| | | | 156/345.24 |
| 2007/0227667 A1 | 10/2007 | Yamazawa | |
| 2007/0227677 A1 | 10/2007 | Yu et al. | |
| 2015/0364300 A1 | 12/2015 | Galli | |
| 2016/0300699 A1* | 10/2016 | Kim | G01J 3/443 |
| 2017/0148613 A1* | 5/2017 | Oh | H01R 9/05 |

OTHER PUBLICATIONS

International Search Report for PCT International Patent Application No. PCT/EP2018/057556; dated Jun. 26, 2018; (5 pages).

Seiji Samukawa et al., "The 2012 Plasma Roadmap", Journal of Physics D: Applied Physics, 2012, vol. 45, (37 pages).

Peter J. Bruggeman et al., "Retrospective on the 2012 plasma roadmap", Journal of Physics D: Applied Physics, 2016, vol. 49 (43), (3 pages).

M. B. Hopkins, et al., "Plasma diagnostics in industry", Plasma Physics and Controlled Fusion, 2000, vol. 42 (12B), (9 pages).

\* cited by examiner

SYSTEM AND METHOD FOR REMOTE SENSING A PLASMA

CROSS REFERENCE TO RELATED APPLICATIONS

This application is a national phase under 35 U.S.C. § 371 of International Application No. PCT/EP2018/057556 filed Mar. 23, 2018, which claims priority to and benefit of European Patent Application No. 1705202.8 filed Mar. 31, 2017, and the entirety of these applications are incorporated by reference herein.

FIELD

A system and method for remote sensing of plasma.

BACKGROUND

Improved control over plasma properties in industrial semiconductor processing equipment is important due to the trend towards increased process automation.

Invasive plasma diagnostic techniques are undesirable in most industrial circumstances given the often harsh processing conditions which prove detrimental to many probes, and the fact that the presence of the probes themselves can alter the characteristics of the plasma. The disruptive impact of fitting such immersive diagnostics to existing fabrication infrastructures must also be considered. Installation of invasive probes can potentially introduce additional complexities to a fabrication line which adversely impacts process replication, a key necessity for high volume production.

Real time, non-invasive and installation-free plasma monitoring techniques are therefore particularly advantageous in many of these industrial scenarios, for example US patent publication number US2005183821 discloses a non-invasive radio frequency antenna placed in close proximity to an activated plasma and configured to monitor a plasma. Other applications are discussed in Seiji Samukawa, et al. The 2012 plasma roadmap. Journal of Physics D: Applied Physics, 45(25):253001, 2012; Peter J Bruggeman and Uwe Czarnetzki. Retrospective on the 2012 plasma roadmap. Journal of Physics D: Applied Physics, 49(43):431001, 2016; and M B Hopkins and J F Lawler. Plasma diagnostics in industry. Plasma Physics and Controlled Fusion, 42(12B): B189, 2000.

The application of a small wire loop or coil encased in an electro-static shield, for example using quartz/ceramic, to 'inductively' probe the magnetic flux within a plasma discharge is well established. This approach, known as B-dot or dB/dt probes, has been used extensively since the 1960's. US patent publication US2007/227667A1, Yamazawa et al, discusses the application of a pair of such shielded coiled probes positioned within a plasma chamber. An embodiment elaborates on the earlier ideas of the B-dot probe which are moved within a plasma volume to study spatial variations of a plasma's internal magnetic field and current density. PCT Patent Publication number WO2007/041280A2, OnWafer, discloses a wafer based version of this strategy in which a dielectric covered coil is fixed on a wafer work-piece while another US patent publication US2006/169410, Maeda et al, installs a similar sensing element via a quartz rod inserted into the gas shower head of a chamber electrode. US patent publication US2015/364300A1, Galli, describes the submersion of such a coil probe within an inductively coupled plasma source.

The prior art to date basically describes probes which require 'internal' placement and submersion of the sensor within the discharge vessel. Perturbation of the plasma due to probe immersion and in particular the presence of an electrostatic shielding in such scenarios is known to be significant.

It is therefore an object to provide an improved system and method for remote sensing of plasma.

SUMMARY

According to the invention there is provided, as set out in the appended claims, a system to remotely monitor a plasma comprising:

a magnetic field antenna positioned in the near field electromagnetic field of a coupled plasma source wherein the magnetic field antenna is a magnetic loop antenna placed in the near electromagnetic field or the like.

A novel approach to remotely monitor low pressure non-equilibrium plasmas is provided. A magnetic field antenna is positioned in the near field of a plasma source. Magnetic flux from plasma currents, present in the vicinity of the viewport, is intercepted via a calibrated loop antenna. A radio system (spectrum analyser) is utilised to analyse the low power signal levels across a wide frequency band. Plasma parameters, such as series (or geometric) resonance plasma and electron-neutral collision frequencies are evaluated via a fitting of resonant features present on higher harmonics of the driving frequency. This approach advances remote, non-invasive and installation free plasma monitoring. In one embodiment the plasma is a low pressure non-equilibrium plasma.

In contrast to the prior art, the magnetic flux radiated from a view-port (or equivalently any non-conducting external access port, is exploited in the present invention. This enables a 'remote' detection of plasma currents without any physical alteration of the discharge vessel during probe installation. This strategy removes any disturbance caused by internal probe installation and is therefore particularly advantageous for deployment on existing fabrication lines which are highly sensitive to alteration. Further, the application of a partially shielded loop antenna, prevalent in Electro-magnetic compliance (EMC) testing, in which the electro-static shielding via a gap in its coverage actually induces the probe current is distinct from previous approaches to intercept magnetic flux from a plasma discharge. The wide frequency operation range and rejection of the E field are key advantages of such shielded loop antenna designs.

Monitoring of frequencies near the driving frequency are shown as an effective proxy to monitor current variations in the plasma. This has diagnostic advantages as a contact-less sensor for endpoint detection (e.g. optical emission failure due to window coating) and for identification of arcing, pump or matching failure events, common 'nuisance events' in fabrication scenarios.

Frequency analysis of the higher harmonics present in the near field signal at 20 mTorr (2.7 Pa) showed resonance behaviour which is linked to fundamental plasma parameters. Extraction of the series (or geometric) plasma and electron-neutral collision frequencies is demonstrated for an oxygen plasma.

In one embodiment there is provided a system to remotely monitor a plasma comprising:

a magnetic field antenna positioned in the near electromagnetic field of a coupled plasma source wherein the magnetic field antenna is a magnetic loop antenna placed in the near electromagnetic field and adapted to measure near field signals emitted from the plasma source.

In one embodiment the magnetic loop antenna is inductively coupled to the plasma source and the system is adapted to analyse near-field radio emissions of the plasma source using a radio emission spectroscopy (RES).

In one embodiment the near field signals comprises near H field signals.

In one embodiment the near H field signal intensity drops with distance as a function of distance from the magnetic field antenna and the plasma source.

In one embodiment the signal intensity drops with distance as a function of $1/r^3$ where r is the distance from the magnetic field antenna and the plasma source In one embodiment there is provided a module to perform a frequency analysis of higher harmonics present in the near field signal to provide a resonance behaviour dependent to plasma parameters of the plasma source and outputting a condition of the plasma source based on said analysis.

In one embodiment the frequency analysis is performed for different operating pressures.

In one embodiment the magnetic loop antenna is inductively or capacitively coupled to the plasma source.

In one embodiment the magnetic loop antenna is calibrated to enable a calculation of a frequency dependent coupling factor between a current associated with the plasma and an induced antenna signal.

In one embodiment a radio system is configured to analyse low power signal levels across a wide frequency band.

In one embodiment the signal is localised to a proximity of a viewport to enable signal isolation to the plasma source. In the context of the present invention a viewport can be interpreted as a typically sealed glass, quartz, or dielectric window in a chamber, these being very typical for most plasma tools. Furthermore, the system and method of the invention does not have to be able to visually observe the plasma through these viewports, and said viewports are still usable even if the system cannot directly "see" the plasma by line of sight.

In one embodiment a measured resonance plasma frequency and an electron-neutral collision frequency are correlated via a fitting of resonant features present on higher harmonics of a driving frequency.

In one embodiment the correlation provides a factor to identify one or more of the following: arcing, pump or matching failure events, associated with the plasma source.

In one embodiment the near field signals comprises near E field signals.

In one embodiment there is provided a first antenna to measure near H field signals and a second antenna to measure near E field signals.

In one embodiment there is provided a module to perform a frequency analysis of higher harmonics present in the near H field signals and E field signals to provide a resonance behaviour dependent to plasma parameters of the plasma source.

In one embodiment there is provided a system to remotely monitor a plasma comprising:
a magnetic field antenna positioned in the near electromagnetic field of a plasma source wherein the magnetic field antenna is a magnetic loop antenna placed in the near electromagnetic field.

In a further embodiment there is provided a method to remotely monitor a low pressure non-equilibrium plasma comprising the steps of:
positioning a magnetic field antenna in the electromagnetic near field of a coupled plasma source wherein the magnetic field antenna is a magnetic loop antenna placed in the near electromagnetic field and adapted and adapted to measure near field signals emitted from the plasma source.

In one embodiment the steps of measuring a resonance plasma frequency and an electron-neutral collision frequency; and correlating said frequency measurements via a fitting of resonant features present on higher harmonics of a driving frequency.

In another embodiment there is provided a method for intercepting near field radio emissions in the vicinity of a low pressure non-equilibrium plasma by using a magnetic loop antenna.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

Figure 1:
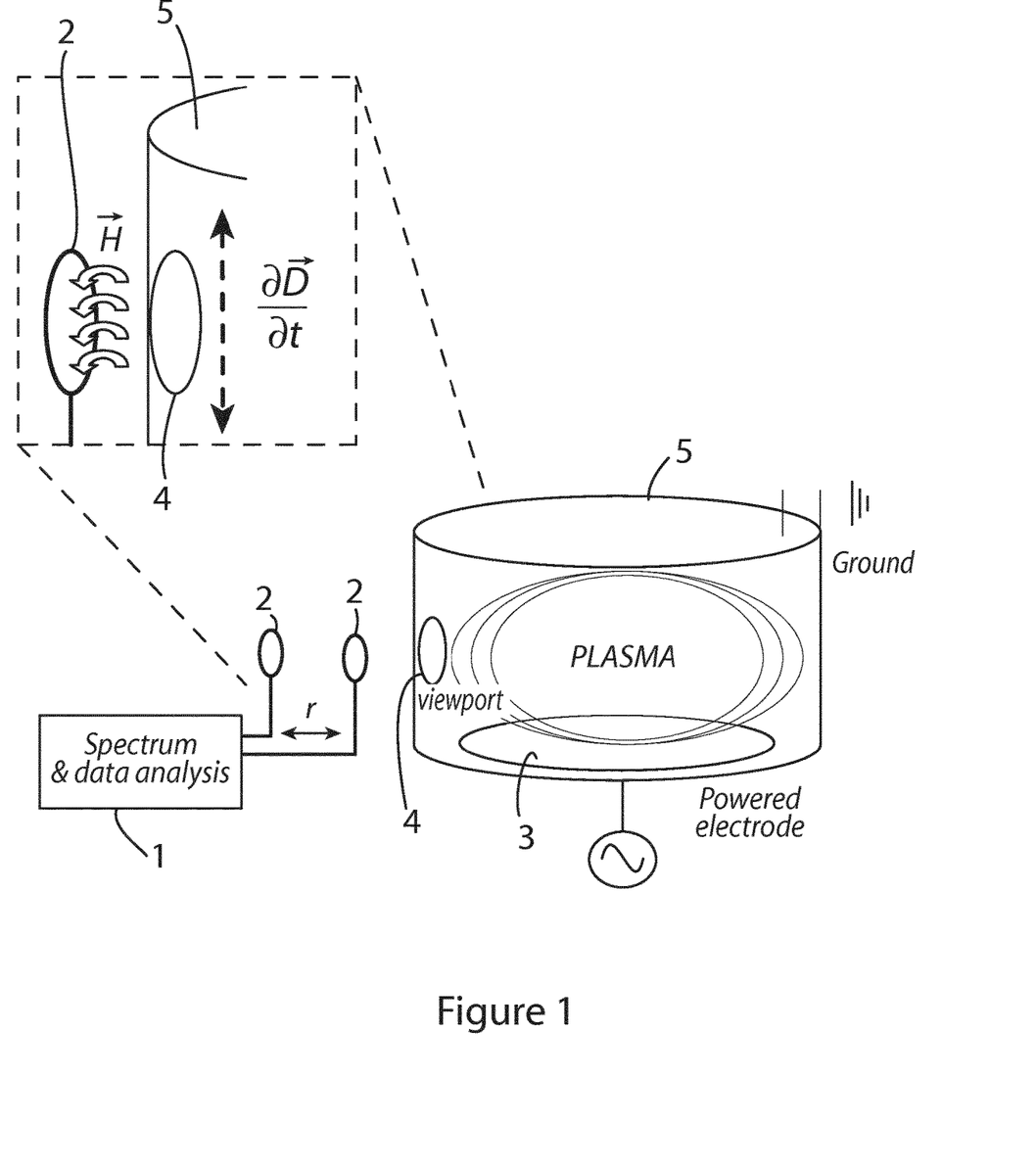
FIG. 1 illustrates a system to remotely monitor a low pressure non-equilibrium plasma according to one embodiment of the invention.

FIG. 1 illustrates a system to remotely monitor a low pressure non-equilibrium plasma according to one embodiment of the invention indicated by the reference numeral 1. At least one magnetic field antenna 2 is positioned in the near field of a capacitively coupled plasma source 3. It will be appreciated that the system is applicable to any plasma source, be it capacitively or inductively coupled, or a plasma induced by laser heating or other means. Magnetic flux from plasma currents, present in the vicinity of a viewport 4, is coupled via a calibrated loop antenna 2. The system 1 can be embodied as a radio system (spectrum analyser) and utilised to analyse the low power signal levels across a wide frequency band. The signal is localised to the proximity of a viewport, enabling signal isolation to the nearby plasma source. Series (or geometric) resonance plasma and electron-neutral collision frequencies are evaluated via a fitting of resonant features present on higher harmonics of the driving frequency, as described in more detail below.

To date, however, the monitoring of wavelengths emitted in the radio frequency portion of the electromagnetic spectrum from low temperature plasma sources remains unexploited. The present invention provides a system and a method for the measurement and analysis of near-field radio emissions near a low pressure non-equilibrium plasma using a concept hereinafter referred to as radio emission spectroscopy (RES). As illustrated in FIG. 1 a near-field loop antenna 2 (typical diameter ~5-25 mm) intercepts the magnetic flux resulting from currents in proximity to a viewport 4 in the plasma chamber. The loop plane is orientated perpendicular to the viewport 4 to intercept currents transiting between the electrodes. A shielded loop antenna design, often used for magnetic field sensing in electromagnetic interference testing, can be employed here. The spatial behaviour of the magnetic field (strictly magnetostatic field) surrounding plasma currents flowing in proximity to the viewport is given by application of the Biot-Savart law:

$$B(r) = \frac{\mu_0}{4\pi} \int \int \int_V \frac{(J dV) \times r}{|r|^3}$$

where dV is the volume element for current density J, and r represents the separation between the current volume and antenna position r.

Figure 2:
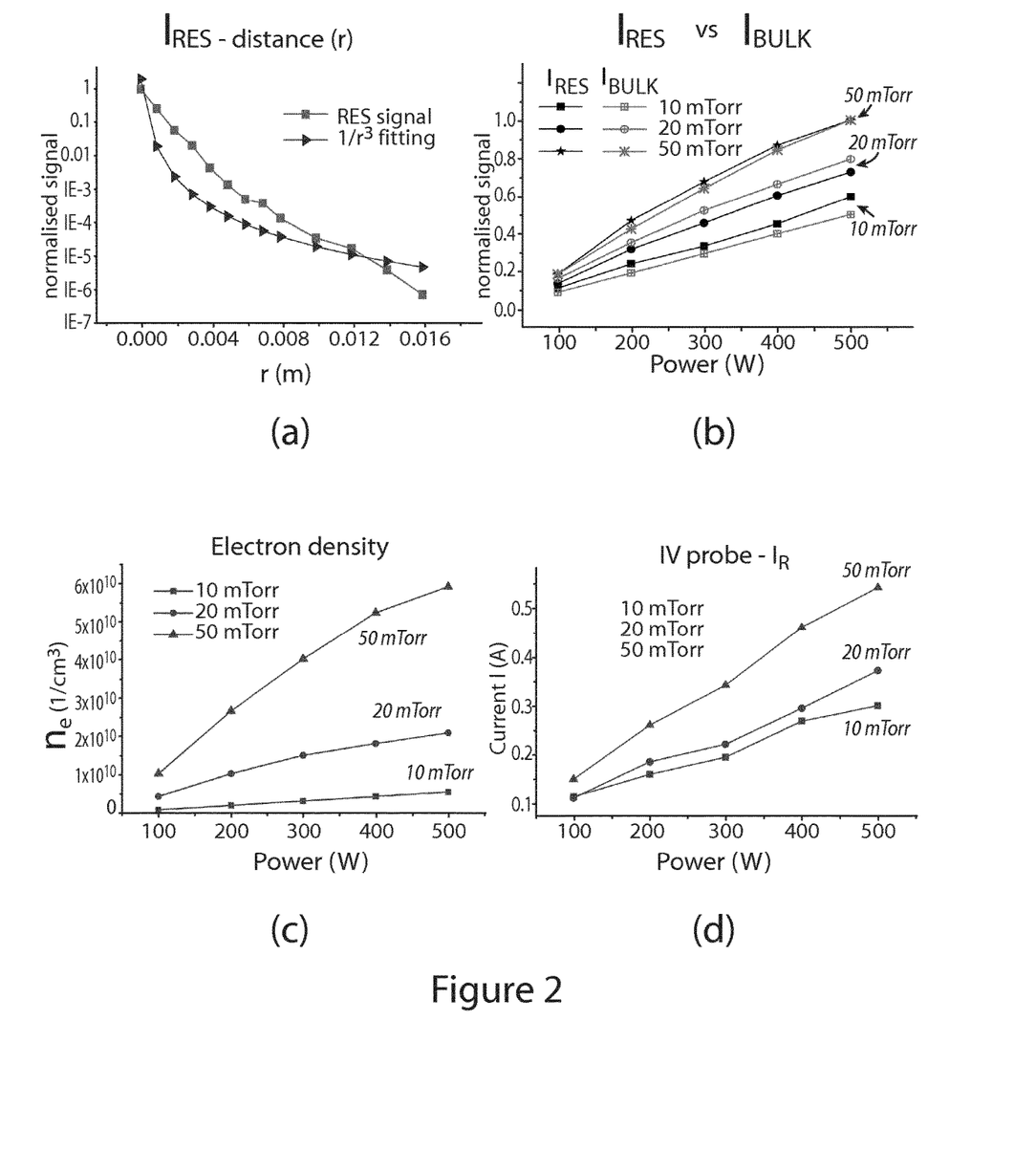
FIG. 2 illustrates (a) Distance dependence (r in FIG. 1) of induced radio signal $I_{RES}$. (b) Comparison of $I_{RES}$ with the bulk plasma current $I_{bulk}$. (c) Electron density values in centre of discharge using Langmuir probe. (d) Resistive component (Is) of the total current measured by an in-line I-V probe.

An important aspect of the invention is the fact that measured currents or voltages in the near field fall off is approximately $1/r^3$, indicating near field operation. If the signals fall off as $1/r^2$, or similar, then they are not listening to the near field. This is illustrated in FIG. 2 where there is shown in (a) Distance dependence (r in FIG. 1) of induced radio signal $I_{RES}$. (b) Comparison of $I_{RES}$ with the bulk plasma current $I_{bulk}$. (c) Electron density values in centre of discharge using Langmuir probe. (d) Resistive component ($I_R$) of the total current measured by an in-line I-V probe.

In the context of the present invention the plasma chamber 5 acts as a radiation source emitting electromagnetic radiation into its environs. The antenna system 2 is positioned in the 'near' portion of this radiation field. This is evidenced by observation of the signal intensity drop with distance as $1/r^3$. In this scenario multi-pole characteristics of the emitting element (i.e. plasma) dominant the positional dependence of the field intensity. Extension of the Bio-Savart formulation to include dipole contributions of the emitting current leads to such a $1/r^3$ dependence.

This behaviour is typical of antenna operation within the near field of a radiation zone sufficiently remote from an emitter and in contrast to probing within a source where spatial variations deviate from such $1/r^3$ behaviour. Indeed, this fact is widely exploited in near field communication systems to enable a remote ('contact-less') but localised coupling to a radiation source.

The ability to localize an emitted radio signal from a plasma 3 by a near-field (magnetic loop) antenna 2 is essential for operation of the invention. This resolution ensures that emissions from nearby sources are effectively minimized as the antenna is sensitive to the H-field near the plasma viewport (or alternatively any other non-conductive surface bounding the plasma).

The localized nature of the radio emission spectroscopy (RES) signal corroborates the source of the emission as the plasma 3 over any far-field radiation sources that likely includes emissions from nearby plasma chambers, the power unit, the match box, other sections of the transmission line, and ambient radio signals. Noise can also be easily removed from the signal in this scenario by an on-line background subtraction at a suitable point away from the near field, as illustrated in FIG. 2a. In other words the invention provides a practical method for signal extraction and is particularly advantageous for implementation in "radio-noisy" fabrication environments.

The system 1 can provide a module to perform a frequency analysis of higher harmonics present in the near field signal to provide a resonance behaviour dependent to plasma parameters of the plasma source, as referenced below with respect to FIGS. 3 to 6. The system can output a condition of the plasma source based on said analysis to inform a user that the plasma is operating correctly.

In operation, the near field loop antenna 2 intercepts the magnetic flux resulting from (displacement) currents transiting between the electrodes in proximity to the viewport. The loop antenna 2 can consists of a flat metal inner conductor coated in a non-conductive shielding blocking electric fields. The antenna can be calibrated using a 50 Ohm micro-strip transmission line and a vector network analyser using a technique commonly employed for electromagnetic compatibility testing in adherence to International Electrotechnical Commission (IEC) directives. It will be appreciated that numerous calibration techniques can be used for example using calibration files provided by RF Explorer (http://j3.rf-explorer.com/downloads) or using a calibration using Helmholtz coils as provided by Beehive Electronics (see for example—https://www.beehive-electronics.com/datasheets/100SeriesDatasheetCurrent.pdf).

Calibration enables the calculation of a frequency dependent coupling factor between the (circuit/plasma) current and the induced antenna signal. Low level signals are analysed using a spectrum analyser with a high dynamic range and resolution bandwidth set <100 Hz. A background scan can be performed at a distance sufficiently remote from the plasma (i.e. where the near field signal is lost), as illustrated in FIG. 1 and subtracted from the near field signal to isolate frequencies intercepted from the plasma. The plasma source used here is a Plasma Lab 100 etching system from Oxford Instruments, as provided by Oxford Instruments Ltd. http://www.oxfordplasma.de/systems/100II.htm. Oxford Instruments Plasma Lab 100.

Figure 3:
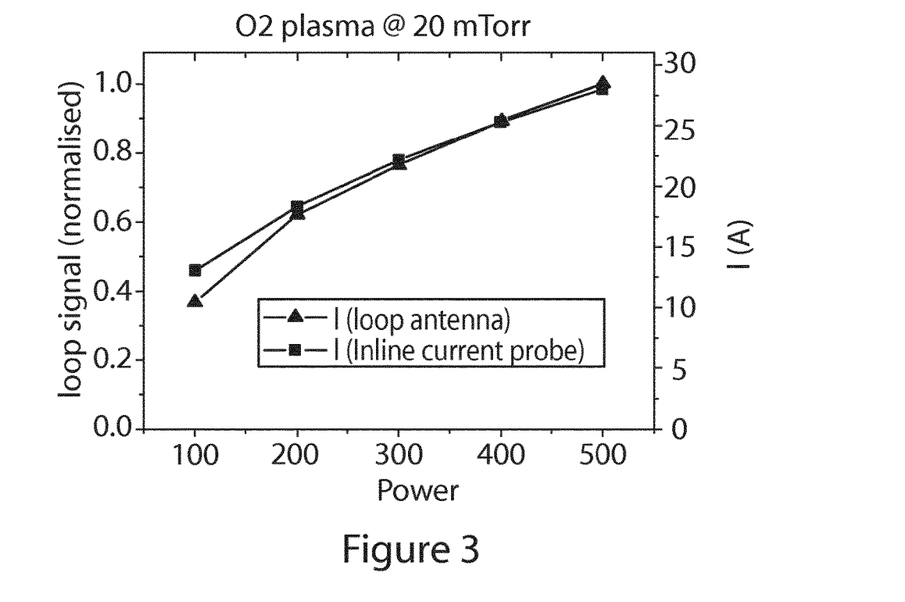
FIG. 3 illustrates a correlation of antenna signal with an in-line current measurement of the plasma using an I-V probe.

The voltage induced in the loop antenna from magnetic fields resulting from plasma currents (I) is based on Faraday's induction principle and can be given by the following:

$$V_{loop} = k \frac{\partial I}{\partial t} \text{ and } V_{Loop}(\omega) = I(\omega) + k(\omega) \tag{1}$$

where $k(\omega)$ represents a frequency dependent coupling factor according to Faraday's induction principle. A correlation of the induced signal with an in-line current measurement (captured with an I-V probe stationed between the matchbox and the powered electrode) is shown in FIG. 3. It was found from a frequency analysis of the higher harmonics present in the near-field signal at lower operating pressures showed resonance behaviour that is linked to fundamental plasma parameters. Extraction of the series (or geometric) plasma and electron-neutral collision frequencies is demonstrated for an oxygen plasma. FIG. 3 illustrates the correlation of antenna signal with an in-line current measurement of the plasma using an I-V probe.

The signal is dominated by frequencies near the driving frequency (13.56 MHz). FIG. 3 shows this signal as an effective proxy for monitoring current variations in the plasma. The monitored current variations have utility as a contact-less sensor for monitoring arcing, pump or matching failure events in fabrication equipment and in endpoint detection where optical diagnostic are limited (e.g. due to window coating).

Figure 4:
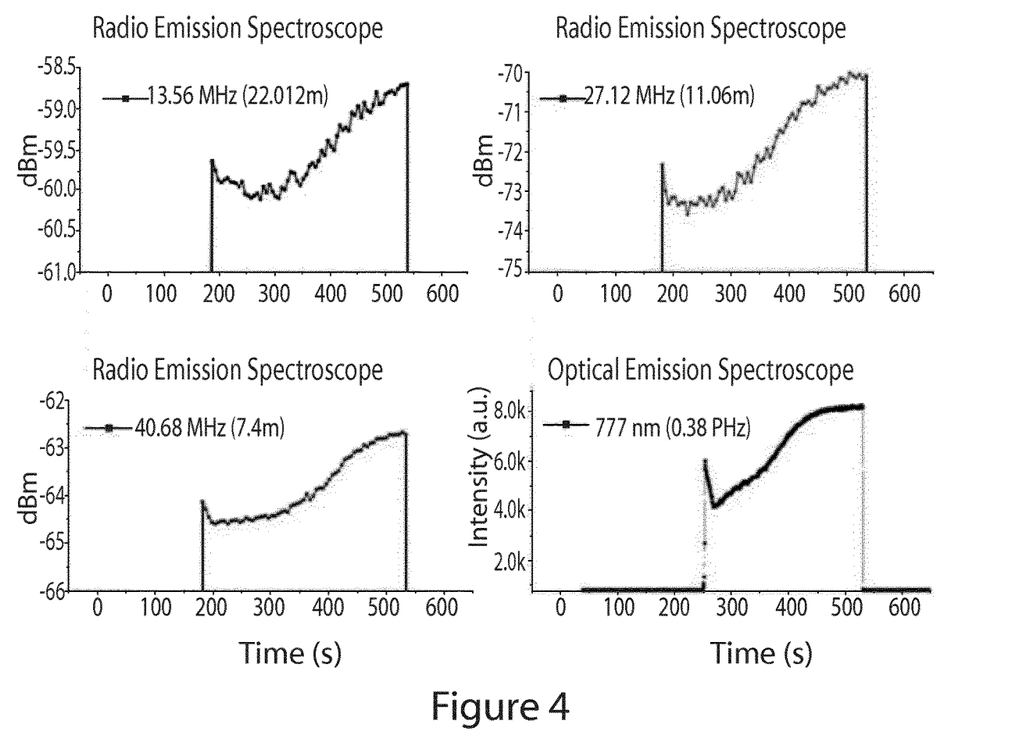
FIG. 4 illustrates the radio emission intercepted (see FIG. 1) for the first three harmonics of driving frequency (13.56 MHz) for an O2 plasma.

FIG. 4 illustrates the radio emission intercepted (see FIG. 1) for the first three harmonics of driving frequency (13.56 MHz) for an O2 plasma ashing of a photo-resist coated wafer. Measurements of the oxygen 777 nm line intensity are carried out using an optical spectrometer. Endpoint (total removal of photo-resist) occurs as the line intensity plateaus (500 seconds in FIG. 2). Monitoring near field radio emission 'Radio Emission Spectroscopy' or RES, according to the invention, is found to be an effective indicator for endpoint here.

The plasma current in capacitively coupled plasma (CCP) discharges is dominated by displacement current $I=I_D=\partial D/\partial t=\partial(\varepsilon_p E)/\partial t$. For a single frequency CCP the frequency content of $I_D$ is dominated by harmonics of the driving frequency (13.56 MHz), however, at lower pressures power is increasingly coupled to higher harmonics which display a distinct resonance behaviour.

One can consider a circuit model of a capacitively coupled plasma with asymmetric sheaths dominated by a single large 'high voltage sheath' present at the powered electrode. This is a common arrangement in industrial plasma etchers. In this model the plasma consists of a capacitive sheath in series with an inductive bulk plasma. The frequency dependence of the total electrical permittivity ($\varepsilon_p$) at harmonics of the driving frequency $\omega$ which are larger than the electron-neutral collision frequency $v$ (i.e. $\omega \gg v$) can be given by.

$$\varepsilon_p = \varepsilon_0 \left( \frac{1}{s} + \frac{(1-\omega_p^2/\omega^2)}{1-s} \right) \quad (2)$$

Here s, the sheath width is normalised to the gap width (0<s<1) and $\omega_p$ is the plasma frequency.

Equation 2 has a minimum for $\omega=\sqrt{s}\omega_p$ corresponding to the well-known series (or geometric) resonance frequency $\omega=\omega_g$. As the sheath width oscillates over the applied voltage cycle, $\omega_g$ varies in the interval $s_{min}$ to $s_{max}$ (approximating a fixed $\omega_p$ bulk plasma density). Resonance behaviour in the signals higher harmonics is shown in FIG. 4 for an oxygen plasma. Emission is found to occur primarily around narrow emission bands ($\approx\Delta 100$ Hz) located at harmonics of the source driving frequency (13.56 MHz). The occurrence of the two primary resonances is found here. This is attributed to the sheath variation over the applied voltage cycle which ranges from $s_{min}$ to $s_{max}$. The acceleration of the Electric field (which is proportional to the induced antenna voltage) coincides with the occurrence of $s_{min}$ and $s_{max}$ enhancing the two primary resonances shown in FIG. 5. Damping of the series resonance is due to the electron-neutral collisions given by the frequency $v$ and is constrained in the upward direction by the driving frequency $\omega$ (i.e. $v>13.56$ MHz).

A Gaussian distribution is fitted to the upper resonance peaks shown in FIG. 4. The geometric ($\omega_g$) and electron-neutral collision ($v$) frequencies are given by the fitted mean ($\omega_g=\mu$) and Full Width at Half Maximum (FWHM) $v\approx 2.355\sigma$ shown in FIG. 5. The maximum sheath width is estimated here as 0.23 or 23% of the discharge gap and is found to be approximately static across the power range of interest. This estimation is achieved by employment of the Child sheath law coupled with a combination of Langmuir probe measurements for electron density and temperature and I-V measurements for estimation of the sheath voltage.

The plasma density can now be calculated using the relation $\omega_p=\omega_g/\sqrt{s}$. The value of $1/\sqrt{s}$ is $\approx 2$ here, giving an electron plasma frequency ranging from 575 MHz at 200 W applied power to 653 MHz at 500 W. This compares to Langmuir probe measurements (preformed at the discharge centre) which range from 913 MHz at 200 W to 1.3 GHz at 500 W. The discrepancy in plasma frequency values is due to the lower electron density expected at the chamber wall versus the discharge center which is typically at least an order of magnitude higher. A calibration ratio of $\approx 4$ between the Langmuir probe plasma frequency data taken at the discharge center and the extracted near field geometric plasma frequency across our power range is found here, corroborating a correlative trend.

Figure 5:
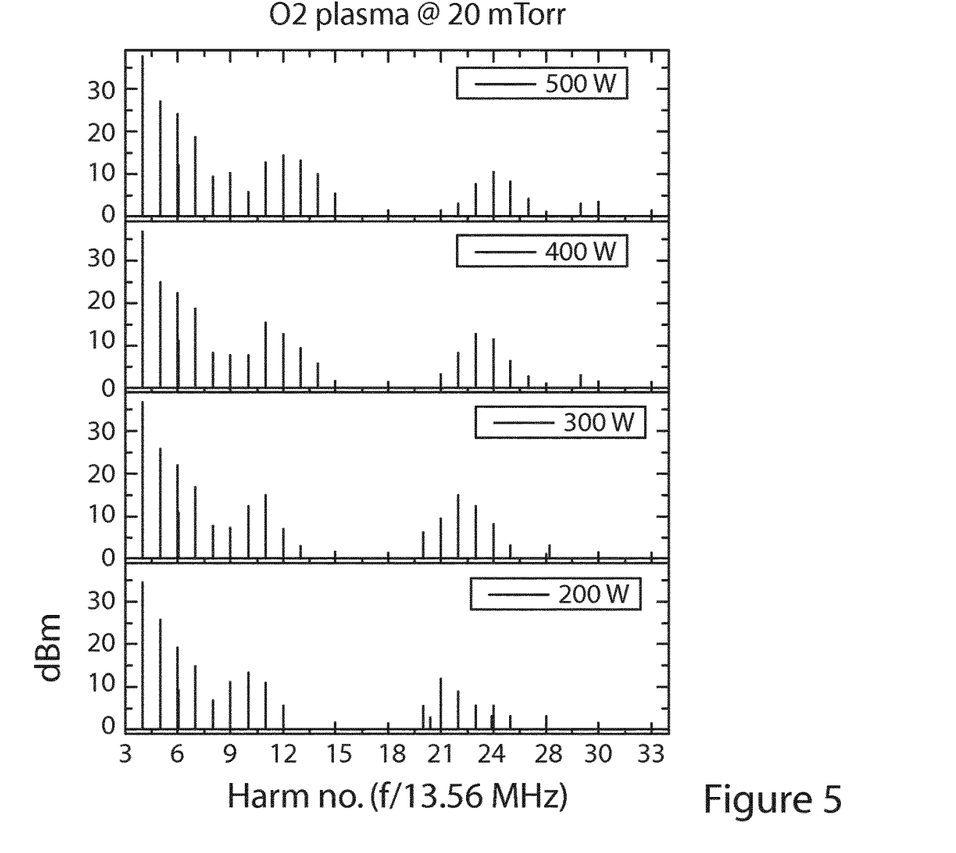
FIG. 5 illustrates near field signal frequency analysis: resonance behaviour found in higher harmonics.
Figure 6:
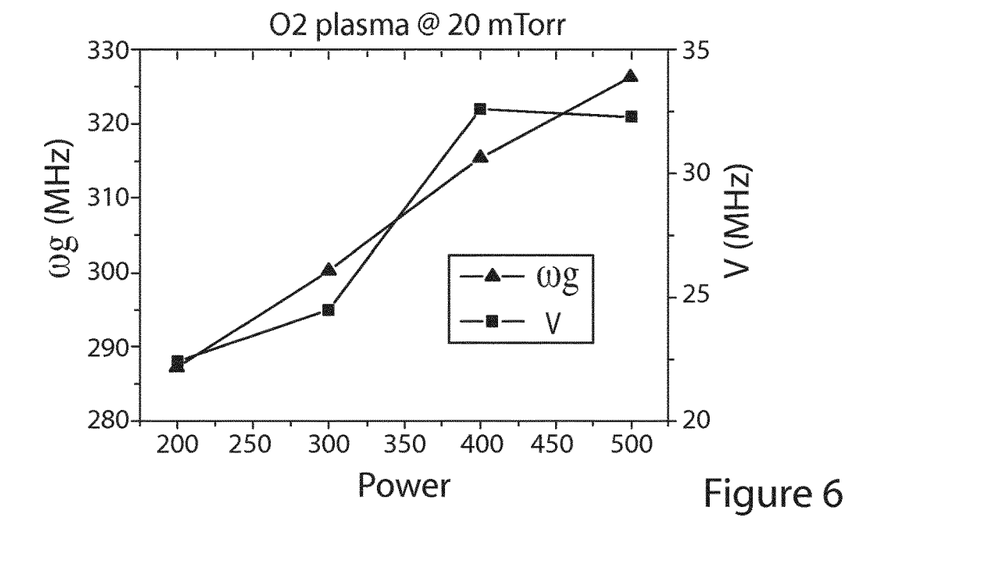
FIG. 6 illustrates extracted values of the series resonance ($\omega_g$) and electron-neutral collision frequencies (v) from harmonic resonance peaks shown in FIG. 5.

FIG. 6 illustrates extracted values of the series resonance ($\omega_g$) and electron-neutral collision frequencies ($v$) from harmonic resonance peaks shown in FIG. 5. Investigations of the radiated (far field) radio signal were also carried out. Results showed a more limited diagnostic potential and insensitivity to the plasma parameters. Frequency analysis revealed harmonic peaking at wavelengths of ~0.5-1 meters across a range of applied powers. This insensitivity likely reflects some physical aspect of the transmission line (e.g. chamber diameter) rather than correlation to any plasma parameter.

A mentioned previously the ability to localise the emitted radio signal from the plasma via a near field (magnetic loop) antenna is important for the operation of the invention. This resolution ensures emissions from nearby sources are effectively minimised as the antenna is sensitive to the H field in the vicinity of the plasma viewport (or alternatively any other non-conductive surface bounding the plasma). This behaviour corroborates the source of the emission as the plasma over far field radiation which likely includes emissions from nearby plasma chambers, the power unit, match box, other sections of the transmission line and ambient radio signals, as illustrated in FIG. 2. Noise can also be easily removed from the signal by an on-line background subtraction at a suitable point away from the near field, as illustrated in FIG. 1.

Suitably the system can comprise a first antenna to measure near H field signals and a second antenna to measure near E field signals. The module can perform a frequency analysis of higher harmonics present in the near H field signals and E field signals to provide a resonance behaviour dependent to plasma parameters of the plasma source.

This provides a practical method for signal extraction and is particularly advantageous for implementation in 'radio-noisy' fabrication environments.

The embodiments in the invention described with reference to the drawings comprise a computer apparatus and/or processes performed in a computer apparatus. However, the invention also extends to computer programs, particularly computer programs stored on or in a carrier adapted to bring the invention into practice. For example, recent advances in microprocessor technology have enabled the emergence of "software defined radio" (SDR) in which traditional radio hardware components have been implemented in software. This has led to recent advances in the flexibility and availability of SDR signal acquisition and spectrum analyzer technologies using program software. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a memory stick or hard disk. The carrier may be an electrical or optical signal which may be transmitted via an electrical or an optical cable or by radio or other means.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A system for remote and contactless monitoring of a plasma source in a plasma chamber, said system comprising:
a magnetic field antenna positioned, in use, in a near electromagnetic field of the plasma source, wherein the magnetic field antenna is a magnetic loop antenna, which, in use, is placed in the near electromagnetic field remote from the plasma chamber and is inductively coupled to the plasma source and wherein the magnetic loop antenna is adapted to measure near field signals emitted from the plasma source; and
a module arranged to perform a frequency analysis of fundamental and higher harmonics present in the near field signals to provide a resonance behaviour dependent on plasma parameters of the plasma source, wherein the system is arranged to output a condition of the plasma source based on said frequency analysis.

2. The system of claim 1 adapted to analyse near-field radio emissions of the plasma source using a radio emission spectroscopy (RES).

3. The system of claim 1 wherein the near field signals comprise near H field signals.

4. The system of claim 1 wherein, in use, a near H field signal intensity drops with distance as a function of distance between the magnetic field antenna and the plasma source.

5. The system of claim 4 wherein, in use, the near H field signal intensity drops with distance as a function of $1/r^3$ where r is the distance between the magnetic field antenna and the plasma source.

6. The system of claim 1 wherein the module is arranged to perform the frequency analysis for different operating pressures.

7. The system of claim 1 comprising a module, wherein the module is arranged to remove noise from the near field signals by an on-line background subtraction selected at a suitable point away from the near field.

8. The system of claim 1 wherein the system is arranged to calibrate the magnetic loop antenna such that a calculation is enabled of a frequency dependent coupling factor between a current associated with a plasma and an induced antenna signal.

9. The system of claim 1 wherein the system comprises a radio system configured to analyse low power signal levels across a wide frequency band, and, optionally, wherein the magnetic loop antenna is adapted to measure near field signals localised to a proximity of a viewpoint in the plasma chamber to enable signal isolation to the plasma source.

10. The system of claim 9 wherein the system is adapted to measure a resonance plasma frequency and an electron-neutral collision frequency and to correlate said measured frequencies via a fitting of resonant features present of higher harmonics of a driving frequency, and, optionally, wherein the system is arranged to correlate the measured resonance plasma frequency and the measured electron-neutral collision frequency so as to provide a factor to identify one or more of the following: arcing, pump or matching failure events, associated with the plasma source.

11. The system of claim 1 wherein the near field signals comprises near E field signals.

12. The system of claim 1 comprising a first magnetic loop antenna adapted to measure near H field signals and a second antenna to measure near E field signals, and wherein the system comprises a module configured to perform a frequency analysis of fundamental and higher harmonics present in the near H field signals and E field signals to provide a resonance behaviour dependent on plasma parameters of the plasma source.

13. The system of claim 1, wherein the magnetic field antenna is not in contact with the plasma chamber, wherein the module is remote from the plasma chamber and not in contact therewith.

* * * * *